(12) United States Patent
Ishii et al.

(10) Patent No.: US 10,984,921 B2
(45) Date of Patent: Apr. 20, 2021

(54) CONDUCTIVE PASTE

(71) Applicant: SEKISUI CHEMICAL CO., LTD., Osaka (JP)

(72) Inventors: Masahiro Ishii, Osaka (JP); Akira Nakasuga, Osaka (JP); Shoji Nozato, Osaka (JP); Shigekatsu Ohnishi, Osaka (JP)

(73) Assignee: SEKISUI CHEMICAL CO., LTD., Osaka (JP)

( * ) Notice: Subject to any disclaimer, the term of this patent is extended or adjusted under 35 U.S.C. 154(b) by 0 days.

(21) Appl. No.: 16/622,188

(22) PCT Filed: Jun. 28, 2018

(86) PCT No.: PCT/JP2018/024492
§ 371 (c)(1),
(2) Date: Dec. 12, 2019

(87) PCT Pub. No.: WO2019/004331
PCT Pub. Date: Jan. 3, 2019

(65) Prior Publication Data
US 2020/0118702 A1 Apr. 16, 2020

(30) Foreign Application Priority Data

Jun. 30, 2017 (JP) .............................. JP2017-129176
Jun. 30, 2017 (JP) .............................. JP2017-129177

(51) Int. Cl.
*H01B 1/22* (2006.01)
*C08K 3/04* (2006.01)
(Continued)

(52) U.S. Cl.
CPC ................. *H01B 1/22* (2013.01); *C08K 3/04* (2013.01); *C08K 3/08* (2013.01); *C08K 7/06* (2013.01);
(Continued)

(58) Field of Classification Search
CPC ... H01B 1/22; H01B 1/02; H01B 1/24; C08K 2003/085; B22F 1/00; B22F 1/02; C22C 9/00; C22C 9/06
(Continued)

(56) References Cited

U.S. PATENT DOCUMENTS

2010/0140564 A1   6/2010   Overbreek et al.
2012/0061623 A1*  3/2012   Foreman ............... C09D 11/037
                                                   252/513
(Continued)

FOREIGN PATENT DOCUMENTS

CN    101395233 A    3/2009
CN    104160455 A    11/2014
(Continued)

OTHER PUBLICATIONS

International Search Report for the Application No. PCT/JP2018/024492 dated Aug. 14, 2018.
(Continued)

*Primary Examiner* — Tri V Nguyen
(74) *Attorney, Agent, or Firm* — Cheng Law Group, PLLC

(57) ABSTRACT

Provided is a conductive paste which makes it possible to form a conductive layer having excellent conductivity even when spherical copper powder having a small particle diameter is used. Disclosed is a conductive paste containing a conductive filler and a binder resin. In this conductive paste, when a first coating film is prepared by coating a first paste containing 100 parts by weight of the binder resin and 20 parts by weight of the conductive filler on a first substrate at a coating amount of 100 g/m² and drying and curing the binder resin, the first coating film has a light transmittance of 20% or more, and when a second coating film is prepared by coating a second paste containing the binder resin but not
(Continued)

containing the conductive filler on a second substrate at a coating amount equivalent to a dry solid content of 55 g/m² and drying and curing the binder resin, a film thickness t μm of the second coating film and a shrinkage ratio α % obtained by the following formula (1) satisfy a relationship of the following formula (2): α=(1−(arc length of a surface of the second coating film after drying and curing)/(arc length of a second substrate after drying and curing))×100 Formula (1) and α≥(5t+50)×10⁻³ Formula (2).

6 Claims, 3 Drawing Sheets

(51) Int. Cl.
    *C08K 3/08*           (2006.01)
    *C08L 31/04*         (2006.01)
    *C08K 7/06*           (2006.01)
    *C08K 9/02*           (2006.01)

(52) U.S. Cl.
    CPC ................ *C08K 9/02* (2013.01); *C08L 31/04* (2013.01); *C08K 2003/085* (2013.01); *C08K 2201/001* (2013.01); *C08K 2201/003* (2013.01); *C08L 2203/16* (2013.01); *C08L 2203/202* (2013.01); *C08L 2203/206* (2013.01); *C08L 2312/00* (2013.01)

(58) Field of Classification Search
    USPC ..... 252/506, 510, 511, 518.1, 519.3, 519.32, 252/519.33, 502.3, 521.3, 500
    See application file for complete search history.

(56) References Cited

U.S. PATENT DOCUMENTS

| | | | |
|---|---|---|---|
| 2014/0203222 A1 | 7/2014 | Ito et al. | |
| 2015/0017457 A1 | 1/2015 | Mizuno et al. | |
| 2016/0168395 A1 | 6/2016 | Ohnishi | |
| 2016/0326381 A1 | 11/2016 | Akashi et al. | |
| 2017/0216914 A1 | 8/2017 | Ohnishi | |
| 2018/0061520 A1 | 3/2018 | Kajita et al. | |
| 2018/0169755 A1 | 6/2018 | Tagami et al. | |

FOREIGN PATENT DOCUMENTS

| | | | | |
|---|---|---|---|---|
| CN | 105556617 A | | 5/2016 | |
| EP | 2 017 016 A1 | | 1/2009 | |
| EP | 2 415 731 A1 | | 2/2012 | |
| EP | 3 029 686 A1 | | 6/2016 | |
| EP | 3 115 130 A1 | | 1/2017 | |
| EP | 3 309 798 A1 | | 4/2018 | |
| JP | 11-7830 A | | 1/1999 | |
| JP | 2007-165305 A | | 6/2007 | |
| JP | 2009-26558 A | | 2/2009 | |
| JP | 2011076866 A | * | 4/2011 | ............... C09D 5/02 |
| JP | 2013101948 A | * | 5/2013 | ............... C09D 5/02 |
| JP | 2016-115561 A | | 6/2016 | |
| JP | 2016-151029 A | | 8/2016 | |
| JP | 2016-207377 A | | 12/2016 | |
| WO | WO-2015/016202 A1 | | 2/2015 | |
| WO | WO-2015/133474 A1 | | 9/2015 | |
| WO | WO-2016/140185 A1 | | 9/2016 | |
| WO | WO-2016/199811 A1 | | 12/2016 | |
| WO | WO-2017/159381 A1 | | 9/2017 | |

OTHER PUBLICATIONS

Written Opinion of the International Searching Authority (PCT/ISA/237) for Application No. PCT/JP2018/024492 dated Aug. 14, 2018.
Written Opinion of the International Searching Authority (PCT/ISA/237) for Application No. PCT/JP2018/024492 dated Aug. 14, 2018 (English Translation dated Jan. 9, 2020).
The First Office Action for Application No. 201880028581.6 from The State Intellectual Property Office of the People's Republic of China dated Sep. 18, 2020.
Supplementary European Search Report for the Application No. EP 18 823 631.9 dated Feb. 19, 2021.

* cited by examiner

[FIG. 1]
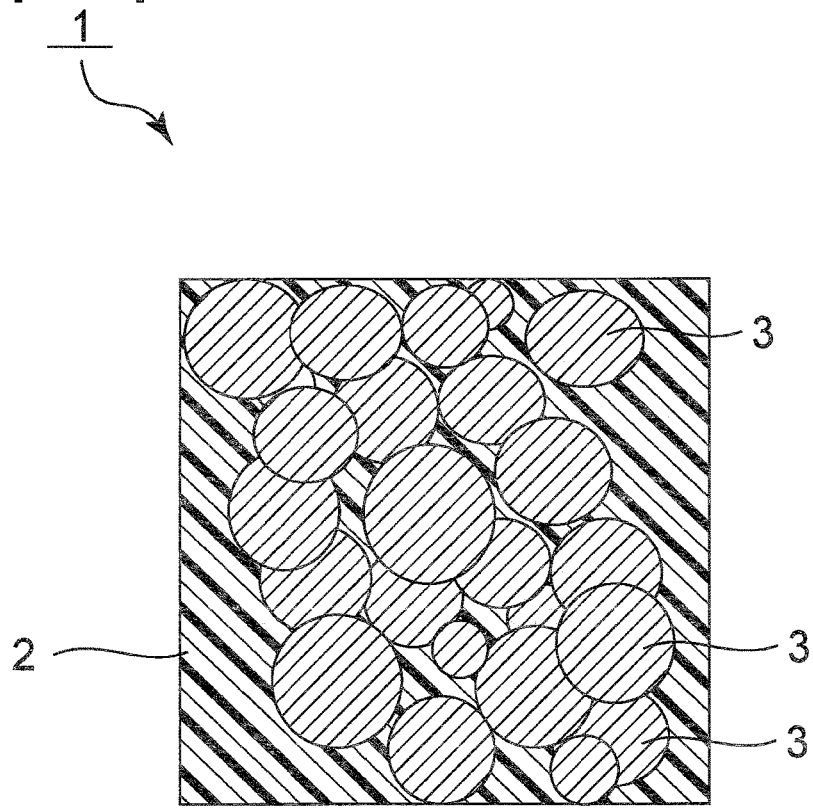
[FIG. 2]
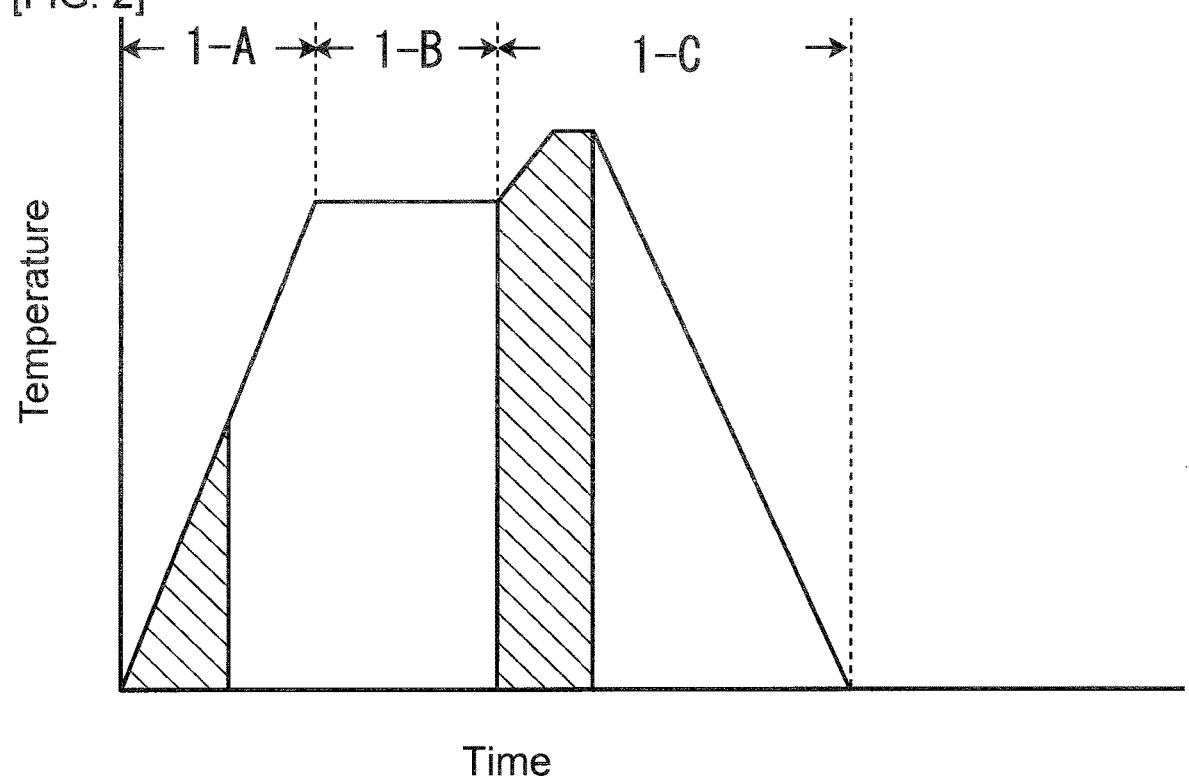

[FIG. 3]
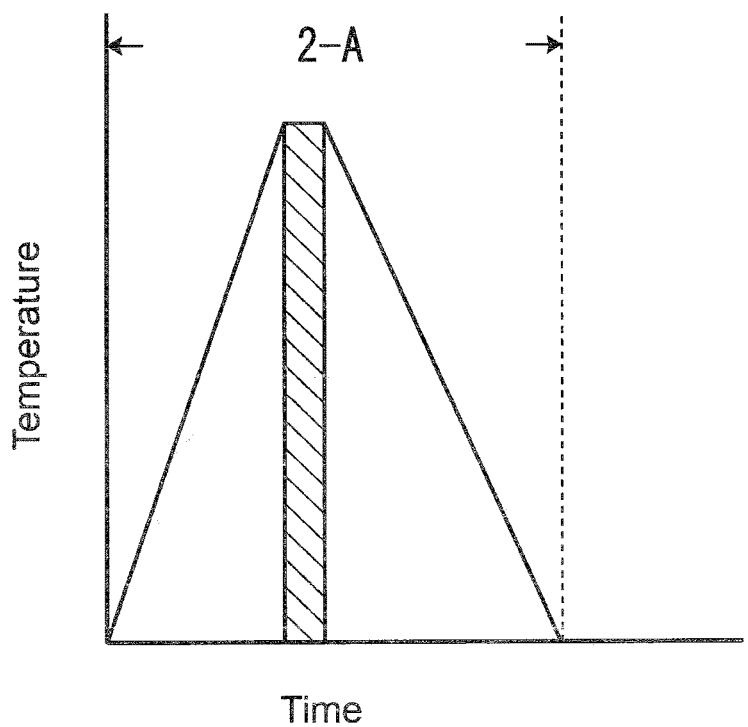
[FIG. 4]
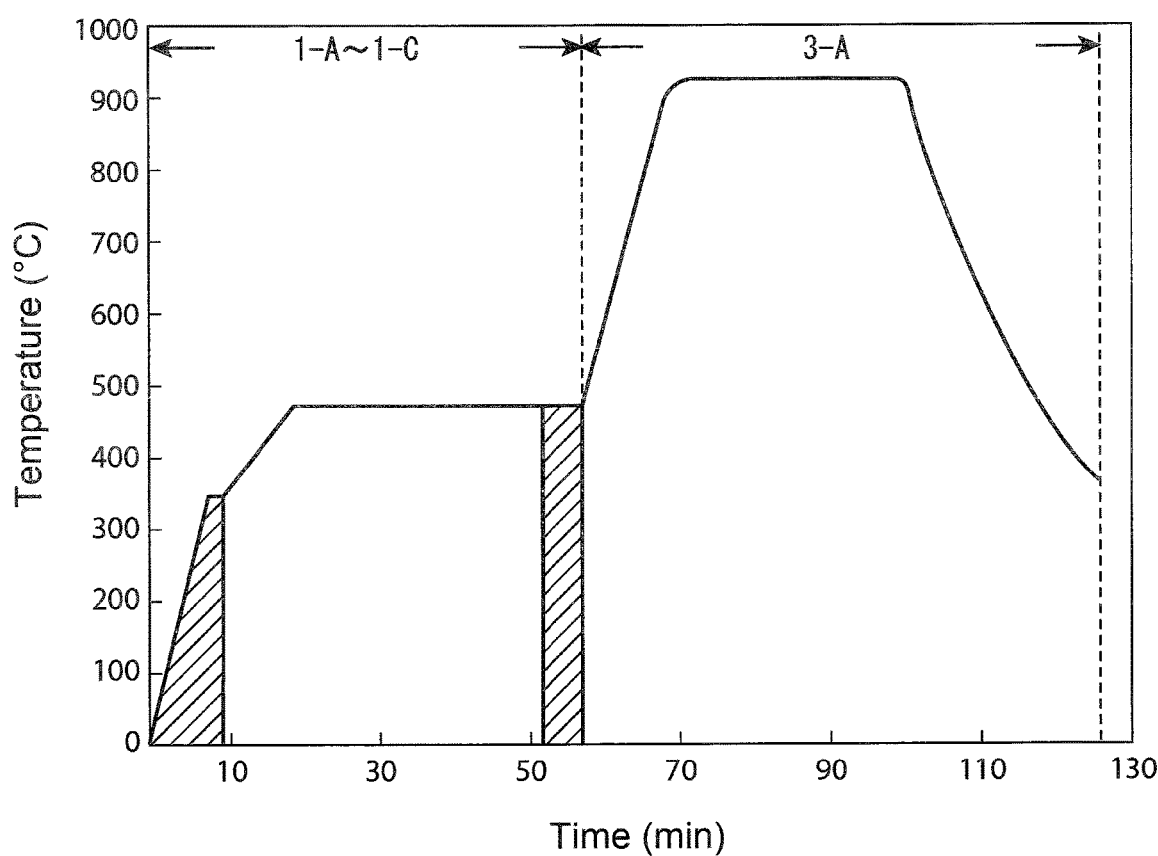

[FIG. 5]
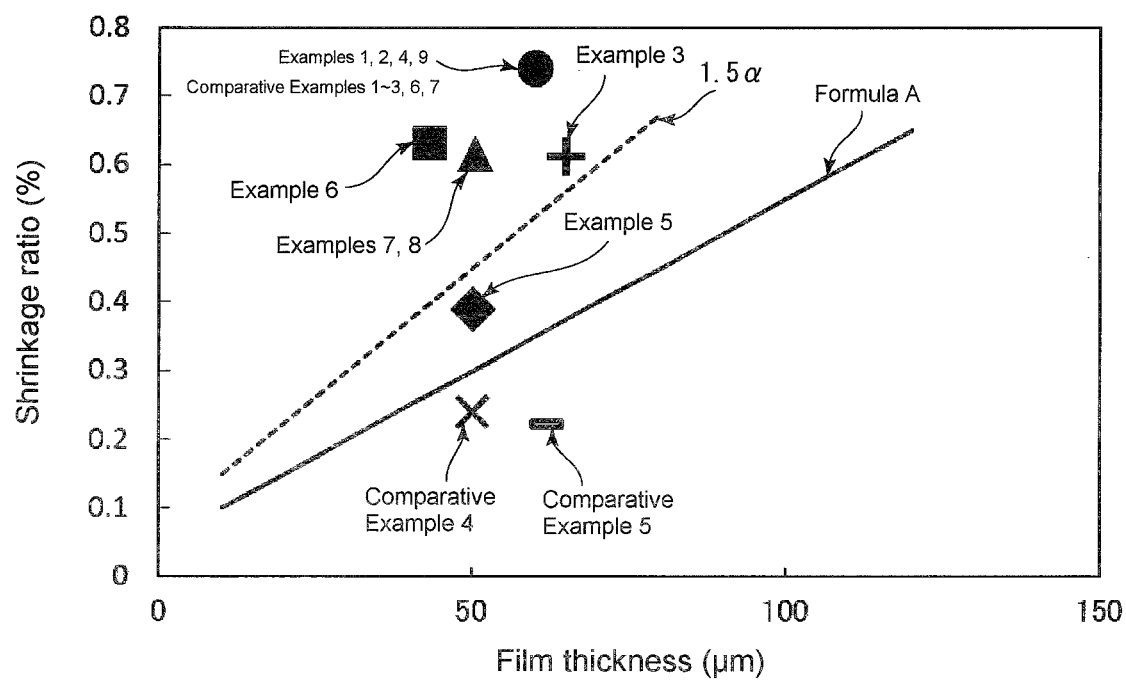

CONDUCTIVE PASTE

TECHNICAL FIELD

The present invention relates to a conductive paste containing a conductive filler and a binder resin.

BACKGROUND ART

In the prior art, a conductive paste is used for electrodes of electronic parts, wiring, circuit formation, and the like. As such a conductive paste, a paste formed by dispersing a conductive filler in a binder resin is widely known.

As the conductive filler used for the conductive paste, silver powder has been used. However, there are problems that in addition to being expensive, the silver powder has high migration properties. Thus, use of copper powder as a substitute for silver powder is being studied. However, copper powder tends to be oxidized. Accordingly, when a conductive paste in which copper powder is used as a filler is coated and then heated and cured in the atmosphere, a copper oxide film is likely to be formed by a reaction with oxygen. There is a problem that electric resistance increases due to the influence of the oxide film.

Patent Document 1 below discloses a conductive filler formed by coating copper powder, flattened by a special device, with a chelating agent. Patent Document 2 below discloses a conductive filler formed of wet-type reduced copper powder having a neck portion. Patent Document 3 below discloses a conductive filler coated with amine and carboxylic acid. Patent Document 4 below discloses a conductive filler coated with fatty acid and triethanolamine mixture.

RELATED ART DOCUMENT

Patent Documents

Patent Document 1: JP H11-7830 A
Patent Document 2: JP 2007-165305 A
Patent Document 3: WO 2016/199811 A
Patent Document 4: WO 2016/140185 A

SUMMARY OF THE INVENTION

Problems to be Solved by the Invention

Since the conductive fillers of Patent Document 1 and Patent Document 2 have a special shape, they cannot be generally widely used due to problems of production amounts and cost. Meanwhile, in the methods of Patent Document 3 and Patent Document 4, the effect is confirmed in the conductive filler having a large particle diameter. However, when the method is applied to spherical copper powder having an average particle diameter of 5 μm or less obtained by a general atomization method for the purpose of improving screen printing properties, there is a problem that the conductivity is low and the resistance becomes high. Therefore, when spherical copper powder having an average particle diameter of 5 μm or less obtained by atomization method is used as a conductive filler, it is difficult to obtain a conductive layer having high conductivity. In particular, when a resin or solvent is changed for the purpose of improving screen printing properties, the conductivity may be lowered.

An object of the present invention is to provide a conductive paste which makes it possible to form a conductive layer having excellent conductivity even when spherical copper powder having a small particle diameter is used.

Means for Solving the Problems

A conductive paste according to the present invention contains a conductive filler and a binder resin. In this conductive paste, when a first coating film is prepared by coating a first paste containing 100 parts by weight of the binder resin and 20 parts by weight of the conductive filler on a first substrate at a coating amount of 100 g/m$^2$ and drying and curing the binder resin, the first coating film has a light transmittance of 20% or more, and when a second coating film is prepared by coating a second paste containing the binder resin but not containing the conductive filler on a second substrate at a coating amount equivalent to a dry solid content of 55 g/m$^2$ and drying and curing the binder resin, a film thickness t μm of the second coating film and a shrinkage ratio α % obtained by the following formula (1) satisfy a relationship of the following formula (2).

$$\alpha = (1-(\text{arc length of surface of second coating film after drying and curing})/(\text{arc length of second substrate after drying and curing})) \times 100 \quad \text{Formula (1)}$$

$$\alpha \geq (5t+50) \times 10^{-3} \quad \text{Formula (2)}$$

In a specific aspect of the conductive paste according to the present invention, the conductive filler has an average particle diameter of 1 μm or more and 5 μm or less.

In another specific aspect of the conductive paste according to the present invention, the conductive filler is a composite particle containing copper alloy powder containing at least one kind of transition metals belonging to groups 8 to 10 of the periodic table and a carbon material covering at least a portion of a surface of the copper alloy powder.

In yet another specific aspect of the conductive paste according to the present invention, the transition metal is cobalt.

In yet another specific aspect of the conductive paste according to the present invention, the carbon material is a carbon fiber.

In yet another specific aspect of the conductive paste according to the present invention, the conductive filler has a filler body and a covering layer covering at least a portion of a surface of the filler body, and the covering layer contains a resin having an active hydrogen-containing group and a compound having a functional group capable of reacting with the active hydrogen-containing group.

In yet another specific aspect of the conductive paste according to the present invention, the active hydrogen-containing group is at least one selected from the group consisting of a hydroxyl group, a carboxyl group, an amino group, an imino group and a thiol group.

In yet another specific aspect of the conductive paste according to the present invention, the resin having an active hydrogen-containing group is a polyvinyl acetal resin.

In yet another specific aspect of the conductive paste according to the present invention, the compound having a functional group capable of reacting with the active hydrogen-containing group is a blocked isocyanate.

In yet another specific aspect of the conductive paste according to the present invention, the filler body has an average particle diameter of 1 μm or more and 5 μm or less.

In yet another specific aspect of the conductive paste according to the present invention, the filler body is a composite particle containing copper alloy powder containing at least one kind of transition metals belonging to groups 8 to 10 of the periodic table and a carbon material covering at least a portion of a surface of the copper alloy powder.

In yet another specific aspect of the conductive paste according to the present invention, the transition metal is cobalt.

In yet another specific aspect of the conductive paste according to the present invention, the carbon material is a carbon fiber.

Effect of the Invention

The present invention can provide a conductive paste which makes it possible to form a conductive layer having excellent conductivity even when spherical copper powder having a small particle diameter is used.

BRIEF DESCRIPTION OF DRAWINGS

FIG. 1 is a schematic cross-sectional view showing a first coating film.

FIG. 2 is a view showing a heat profile as an example of a method of producing composite particles.

FIG. 3 is a view showing a heat profile of re-CVD treatment.

FIG. 4 is a view showing a heat profile when a heat treatment step is provided after a CVD step.

FIG. 5 is a graph showing a relationship between film thickness and shrinkage ratio of second coating films obtained in Examples 1 to 9 and Comparative Examples 1 to 7.

MODE(S) FOR CARRYING OUT THE INVENTION

Hereinafter, the details of the present invention will be described.

A conductive paste according to the present invention contains a conductive filler and a binder resin.

In the present invention, a first coating film prepared as described below has a light transmittance of 20% or more. The first coating film can be prepared by coating a first paste containing 100 parts by weight of a binder resin and 20 parts by weight of a conductive filler on a first substrate at a coating amount of 100 g/m² and drying and curing the binder resin.

The light transmittance is a light transmittance at a wavelength of 700 nm. The light transmittance can be measured together with the first substrate by, for example, a spectrophotometer (product number "U-3900" manufactured by Hitachi High-Technologies Corporation). In measuring the light transmittance, a blank specimen is used as a control sample of the light transmittance, and this light transmittance is excluded from an initial light transmittance. The blank specimen can be obtained by coating the same paste as the first paste at a coating amount of 100 g/m² on the first substrate except that this paste contains no conductive filler, followed by drying and curing. In order to suppress variations in measured values due to coating unevenness and the like, measurements are made at 10 different places, and an average value of the measurement results is obtained.

As the first substrate, for example, a transparent substrate such as a heat resistant glass plate can be used. In addition to the conductive filler and the binder resin, the first paste may contain a solvent and an additive. As the solvent and the additive, a solvent and an additive which can be used for the conductive paste described later can be used.

In coating the first paste, when a film thickness cannot be ensured due to the fact that the first substrate is thick and flows, a frame body may be formed on the first substrate with a tape material and the like. After relaxation time is set for 30 minutes after coating, drying and curing may be performed. In this case, the first coating film can be made more uniform, and the measurement result can be further stabilized. The drying and curing temperature can be set to, for example, 120° C. to 200° C. although it depends on the type of the binder resin. The drying and curing time can also be set to, for example, 5 minutes to 60 minutes although it depends on the type of the binder resin.

In the present invention, a film thickness t μm of a second coating film and a shrinkage ratio $\alpha$ % in a one-dimensional direction obtained by the following formula (1) satisfy a relationship of the following formula (2).

$\alpha = (1-(\text{arc length of surface of second coating film after drying and curing})/(\text{arc length of second substrate after drying and curing})) \times 100$    Formula (1)

$\alpha \geq (5t+50) \times 10^{-3}$    Formula (2)

The second coating film can be prepared by coating a second paste containing a binder resin but not containing a conductive filler on a second substrate at a coating amount equivalent to a dry solid content of 55 g/m² (such that the dry solid content of the second paste is 55 g/m²) and drying and curing the binder resin. The film thickness (coating thickness) of the coating film means the film thickness after drying and curing.

In the formula (1), when the arc length of the surface of the second coating film after drying and curing is determined, first, an arc length $L_0$ from one end to the other end in the length direction of the second substrate is obtained. Subsequently, a chord length d, which is the shortest distance between two points from one end to the other end in the length direction of the second substrate, is obtained. Next, from the arc length $L_0$ and the chord length d, a radius $r_0$ and a center angle $\theta$ of the same circle as circular approximation are obtained by the following formulas (3) and (4).

$L_0 = r_0 \times \theta$    Formula (3)

$d = 2 \times r_0 \times \sin\theta$    Formula (4)

Since the radius $r_0$ is obtained from the arc length $L_0$ of the second substrate, the arc length L of the surface of the second coating film after drying and curing can be obtained from the following formula (5) using a radius r obtained by subtracting the coating thickness from the radius $r_0$ and the center angle $\theta$. The above "coating thickness" means the thickness after drying and curing.

$L = r \times \theta$    Formula (5)

From the viewpoint of further enhancing the conductivity of the conductive layer, the shrinkage ratio $\alpha$ % obtained as described above is preferably 1.5 times or more the right side $((5t+50) \times 10^{-3})$ of the formula (2). Furthermore, the shrinkage ratio $\alpha$ % is preferably 10 times or less the right side $((5t+50) \times 10^{-3})$ of the formula (2). When the shrinkage ratio $\alpha$ % is more than 10 times, it is difficult to obtain the effect of further improving conductivity, and problems other than conductivity, such as peeling from the second substrate and breakage of the substrate, may occur.

The second substrate is preferably a resin film. Among them, a polyimide film is more preferred from the viewpoint of further enhancing heat resistance and dimensional stability. The thickness of the resin film is preferably 30 μm or more and 100 μm or less. If the second substrate is too thin, the second substrate may be broken by warping during drying and curing. If the second substrate is too thick, the amount of warpage may be affected.

In addition to the binder resin, the second paste may contain a solvent and an additive. As the solvent and the additive, a solvent and an additive which can be used for the conductive paste described later can be used. The second paste does not contain a conductive filler.

In the present invention, the light transmittance of the first coating film is equal to or more than the above lower limit, and the second coating film satisfies the relationship of the formula (2), and therefore, even when spherical copper powder having a small particle diameter is used as a conductive filler, a conductive layer having excellent conductivity can be formed.

This point can be explained as follows.

First, when the light transmittance of the coating film containing the conductive filler is low, that is, when the dispersibility of the conductive filler is high, the conductive fillers are prevented from being in contact with each other, and the conductivity of the conductive layer may be lowered.

On the other hand, in the present invention, the light transmittance of the first coating film is equal to or more than the above lower limit. Thus, the conductive filler is appropriately aggregated. Specifically, this can be explained by way of a schematic cross-sectional view of the first coating film shown in FIG. 1. A first coating film 1 includes a binder resin 2 after drying and curing and a conductive filler 3 disposed in the binder resin 2. As shown in FIG. 1, the conductive filler 3 is not uniformly dispersed in the binder resin 2 and is adequately aggregated. Thus, the conductive fillers 3 are in contact with each other in the binder resin 2, so that the conductivity of the first coating film 1, that is, the conductive layer is enhanced.

From the viewpoint of further enhancing the conductivity of the conductive layer, the first coating film has a light transmittance of preferably 20% or more, more preferably 25% or more. The upper limit of the light transmittance of the first coating film is about 70%. When the light transmittance of the first coating film is too large, the conductive filler may aggregate more densely, and on the contrary, the conductivity may decrease.

In the present invention, the resistance value of the conductive layer is hardly lowered and the conductivity can be enhanced also because the relationship of the formula (2) is satisfied. The reason for this is as follows: in the shrinkage ratio of a thermosetting resin binder depending on the thickness, the above effect cannot be realized unless the amount of shrinkage is high, so that a cured product more largely reflecting uneven distribution characteristics determined as the light transmittance evaluated in the first coating film described above, that is, a conductive layer having a large conductive path is formed to obtain the above effect.

Hereinafter, each component constituting the conductive paste of the present invention will be described in more detail.

(Conductive Filler)

The conductive paste according to the present invention contains a conductive filler. The mixing ratio of the conductive filler is preferably in the range of 150 parts by weight to 3000 parts by weight and more preferably in the range of 300 parts by weight to 2000 parts by weight with respect to 100 parts by weight of the binder resin. When the mixing ratio of the conductive filler is within the above range, the conductivity of the conductive layer can be further enhanced.

Conductive Filler;

The conductive filler is not particularly limited, and particles of metal such as silver, copper, or nickel, carbon fiber, or the like can be used.

Above all, the conductive filler is preferably composite particles containing copper alloy powder containing at least one kind of transition metals belonging to groups 8 to 10 of the periodic table and a carbon material covering at least a portion of a surface of the copper alloy powder.

The above copper alloy powder is obtained by, for example, powderization through atomization method. The average particle diameter of this copper alloy powder is not particularly limited, but is preferably 0.1 μm to 50 μm, more preferably 0.1 μm to 20 μm, further preferably 0.1 μm to 5 μm, and particularly preferably 1 μm to 5 μm.

When the average particle diameter of the copper alloy powder is in the above preferred range, a conductive paste having excellent conductivity can be more reliably obtained according to the present invention. In the present specification, the average particle diameter refers to an average volume particle diameter, which can be measured by a laser diffraction/scattering type particle diameter distribution measuring apparatus. The average volume particle diameter is calculated by software of the apparatus assuming that the shape of the particle is spherical. In Examples described later, a product number "MT3300 II" manufactured by Microtrac, Inc. was used.

In the present invention, as described above, even when spherical copper powder obtained by atomization method is used as the conductive filler, the conductivity can be enhanced. However, in the present invention, for example, even when flake-shaped powder having an aspect ratio of more than 1 is used as the conductive filler, the conductivity can be enhanced. Accordingly, the conductive filler may be a composite flake particle in which a carbon material covers at least a portion of flake-shaped copper alloy powder.

The transition metal belonging to groups 8 to 10 of the periodic table is not particularly limited, but preferably includes iron, nickel, cobalt and palladium. Among them, iron, nickel or cobalt is preferred, and iron or cobalt is more preferred, since the catalytic activity is higher. Cobalt is further preferred. A plurality of transition metals may be contained.

In addition, the copper alloy powder is desirably cleaned with an etchant or the like before the carbon material is adhered to the surface by CVD treatment described later.

The total content of the transition metal in the copper alloy powder is preferably 0.1% by weight to 10.0% by weight, more preferably 0.6% by weight to 6.0% by weight, and further preferably 0.6% by weight to 1.0% by weight in 100% by weight of the copper alloy powder. When the total content of the transition metal is within the above range, it is possible to further enhance the conductivity of the composite particles as the conductive filler and to reliably provide a conductive paste having more excellent conductivity in accordance with the present invention.

In the composite particles, a carbon material may be attached to the surface of the copper alloy powder so as to cover at least a portion of the surface of the copper alloy powder. Such composite particles can be formed by CVD method in which a carbon source is brought into contact with the surface of the copper alloy powder. As described above, it is desirable that the composite particles be formed by forming a carbon material on the surface of the copper alloy powder by CVD method.

Examples of the carbon material include graphene, a graphene laminate of two or more layers, and carbon fibers. As the carbon fibers, carbon nanofibers having a small fiber diameter are preferred. The carbon nanofibers refer to carbon fibers having a fiber diameter of about 5 nm to 500 nm.

It is desirable that the composite particles have a sea urchin-like shape in which one ends of a large number of carbon nanofibers are bonded to the surface of the copper alloy powder. The composite particles having a sea urchin-like shape are referred to as spiny particles. In the case of the composite particles having a spiny particle shape, high carbon fiber density is desired.

In the case of the composite particles having a spiny particle shape, surprisingly, it has been confirmed that when neighboring composite particles are brought into contact with each other, the conductivity is enhanced more than the case where copper alloy powder is in contact with other copper alloy powder. In other words, when the composite particles having a spiny particle shape are brought into contact with each other, the conductivity is enhanced more than the respective conductivity of the copper alloy powder and the carbon fibers constituting the composite particles. This is considered to be due to the following reason.

When the composite particles are in contact with each other, the carbon fibers constituting the spines of the spiny particles are entangled with each other between neighboring composite particles. Therefore, it is considered that the number of contact points increases, the contact resistance decreases, and the conductivity is dramatically increased.

In addition, it has been confirmed that the carbon fibers have an sp2 structure and have conductivity, but it has not been confirmed that whether or not the carbon fibers exhibit very high conductivity like SWCNTs. In the composite particles used in the present invention, when the conductivity is lower than the conductivity in the length direction of the carbon fibers, it is considered to be preferable that shorter fibers be formed on the surface of the copper alloy powder. Also in this case, the carbon fibers are entangled with each other between neighboring composite particles, and the conductivity can be more effectively enhanced.

In the present invention, when the average particle diameter of the copper alloy powder is about 0.1 μm to 50 μm, it is desired that the length of the carbon fiber is preferably about 0.1 μm to 5.0 μm, more preferably about 0.5 μm to 3.0 μm. This makes it possible to more effectively decrease the contact resistance by the entanglement of the carbon fibers with each other between neighboring composite particles.

Therefore, in the present invention, the amount of the carbon material adhering to the copper alloy powder is also desirably in a certain range. This is because the above carbon material is used in order to reduce the contact resistance between neighboring composite particles though inferior in conductivity to copper.

In the present invention, the amount of the carbon material adhering to the copper alloy powder is not particularly limited, but is preferably 0.2% by weight to 4.0% by weight, more preferably 0.3% by weight to 3.0% by weight, further preferably 0.3% by weight to 1.5% by weight with respect to 100% by weight of the copper alloy powder. When the amount of the carbon material adhering to the copper alloy powder is too small, the copper alloy powder may sinter and aggregate in the CVD step or the heat treatment step described later. On the other hand, when the amount of the carbon material adhering to the copper alloy powder is too large, the carbon material inferior in conductivity to the copper alloy powder may decrease the conductivity.

As the carbon source used to produce the carbon fibers on the surface of the copper alloy powder, various carbon materials can be used. For example, carbon-containing compounds having 1 to 30, preferably 1 to 7, more preferably 1 to 4, and further preferably 1 or 2 carbon atoms can be used as the carbon source. Examples of such compounds can include carbon monoxide, a hydrocarbon, or an alcohol. As the hydrocarbon, a saturated hydrocarbon such as methane, ethane, or propane or an unsaturated hydrocarbon such as ethylene or acetylene can be appropriately used. As the alcohol, methanol, ethanol, or the like can be appropriately used. Among them, a hydrocarbon such as ethylene is preferably used because carbon fibers are easily produced from a catalyst at low temperature.

Further, the carbon source is desirably a material that is a gas at a high temperature of about 300° C. or more. In that case, it is possible to more easily produce carbon fibers in a gas phase reaction.

The size of the composite particles may be appropriately adjusted depending on the application method and use of a conductive paste of interest. For example, in a conductive paste used for a conductive adhesive or the like, the average particle diameter of the composite particles is desirably about 1 μm to 50 μm.

On the other hand, when a conductive paste is printed by stencil or the like, the average particle diameter of the composite particles is desirably 20 μm or less. Further, in a conductive paste used for screen printing, the average particle diameter of the composite particles is desirably about 0.5 μm to 10 μm. When flaky particles are mixed, the average particle diameter of the flaky particles is desirably about 1 μm to 50 μm.

In this manner, the average particle diameter of the composite particles in the present invention may be appropriately selected according to the purpose of use, the application method, and the like.

In the production of the composite particles, for example, after the step of providing copper alloy powder, a carbon source may be brought into contact with a surface of the copper alloy powder by CVD method. Preferably, the copper alloy powder is obtained by atomization method as described above. In this case, copper alloy powder with further small variation in average particle diameter can be obtained.

It is desired that the copper alloy powder is, for example, heat-treated in an oxidation-preventing atmosphere at 400° C. to 800° C. for several minutes to several thousand minutes (catalyst precipitation step), in order to be brought into a state in which catalyst nanoparticles are precipitated and dispersed inside and on surfaces of the composite particles. In order to prevent the aggregation of the powder (copper alloy powder) in the CVD treatment, an apparatus in which powder flows and is uniformly treated like a rotary kiln (rotary furnace) is desirably used.

In addition, in order to prevent the aggregation of the powder in the CVD treatment, small fine particles are further desirably added to the copper alloy powder as a sintering inhibitor. Examples of such fine particles include AEROSIL, carbon black, and ketjen black. The amount of the fine particles added is desirably 0.05% by weight to 2.0% by weight based on the copper alloy powder. The amount of the fine particles added is more preferably 0.1% by weight to 1.0% by weight.

FIG. 2 is a view showing a heat profile as an example of a method of producing composite particles. In FIG. 2, treatment is performed under an ethylene gas atmosphere in the shaded portions and under a nitrogen gas atmosphere for other portions. In step 1-A shown in FIG. 2, copper alloy powder is brought into contact with ethylene gas at 300° C. to 400° C. (aggregation prevention step). In step 1-B, the copper alloy powder is held in a nitrogen gas (inert gas) atmosphere at 400° C. to 650° C. to precipitate a nanocatalyst inside the copper alloy powder and on the surface of the copper alloy powder (catalyst precipitation step). In step 1-C, a carbon material is produced from the nanocatalyst in an ethylene gas atmosphere (carbon material production step).

By bringing the copper alloy powder into contact with ethylene gas at low temperature (300° C. to 400° C.) in step 1-A, the aggregation of the copper alloy powder (aggregation due to placing the copper alloy powder at high temperature for a long time) in step 1-B can be prevented. In addition, also by adding AEROSIL as nano-sized powder, mixing the mixture, and kneading the mixture as required to use the resulting material as a spacer in the pretreatment of step 1-A, the aggregation of the copper alloy powder at high temperature can be prevented. The dispersibility of AEROSIL is good, and the addition of AEROSIL does not affect the conductivity of the conductive paste.

As the method for improving the aggregation, the powder may be dispersed after the catalyst precipitation step (step 1-B) and the carbon production step (step 1-C) may be performed separately in the following step. In addition, after steps 1-A to 1-C, the powder may be processed into a flake shape by a ball mill or the like and a carbon material production step (step 2-A shown in FIG. 3) may be performed separately in the following step. In this manner, it is also possible to perform treatment in the order of CVD treatment, flaking treatment, and re-CVD treatment to obtain composite flake particles.

The preceding step of washing the copper alloy powder with a vital solution (3% by weight nitric acid/ethanol solution) or the like, and then further washing the resulting material with use of ethanol, followed by drying is desirably provided before the CVD treatment (step 1-C).

In the present invention, as shown in FIG. 4, a heat treatment step (step 3-A) can be provided in a nitrogen gas (inert gas) atmosphere after steps 1-A to 1-C. When step 3-A is provided, the crystallinity of the carbon material can be further enhanced, and the conductivity of the carbon material can be further enhanced. Because of high concentration of the catalyst on the surface of the copper alloy powder due to further growth of the nanocatalyst to which the carbon material adheres, and the like, the conductivity when the composite particles to be obtained are kneaded with a binder resin to form a paste can be much more enhanced.

The inert gas is not particularly limited, but nitrogen gas or argon gas is preferably used.

The heat treatment step (step 3-A) is preferably performed at higher temperature than in steps 1-A to 1-C. The range of the temperature is more preferably 750° C. to 1050° C. Step 3-A may be performed separately from steps 1-A to 1-C.

In the present invention, the average particle diameter of the conductive fillers is not particularly limited, but may be, for example, 0.5 µm or more and 50 µm or less. The average particle diameter of the conductive fillers is preferably 1 µm or more and 20 µm or less. The average particle diameter of the conductive fillers may be 1 µm or more and 5 µm or less. Even in that case, a conductive layer having excellent conductivity can be formed.

In the present invention, the conductive filler may have a filler body and a covering layer. At least a portion of the surface of the filler body is covered with the covering layer. A portion of the surface of the filler body may be covered with the covering layer, or the entire surface of the filler body may be covered with the covering layer. The covering layer may contain a resin having an active hydrogen-containing group and a compound having a functional group capable of reacting with the active hydrogen-containing group.

As described above, when the covering layer constituting the conductive filler contains the resin having an active hydrogen-containing group and the compound having a functional group capable of reacting with the active hydrogen-containing group, a conductive layer having more excellent conductivity and toughness can be formed. The reason for this can be explained as follows.

When the resin having an active hydrogen-containing group and the compound having a functional group capable of reacting with the active hydrogen-containing group coexist with each other in the covering layer, the resin and the compound react with each other during drying and curing of the conductive paste. When the resin and the compound react with each other, the covering layer shrinks, and a portion of the filler body covered with the covering layer and a portion of the filler body not covered with the covering layer are formed. Consequently, it is possible to ensure contact between the filler bodies and to further improve the conductivity.

Furthermore, covering with the covering layer makes it possible to further improve toughness. Accordingly, a conductive layer more excellent in both conductivity and toughness can be formed by coating a conductive paste containing a conductive filler having such a covering layer.

As described above, covering of a conductive filler with resin, which has been conventionally difficult, can be made possible. In particular, even when spherical copper powder obtained by more general atomization method is used, a conductive layer having more excellent conductivity and toughness can be formed.

Even when the filler body is subjected to surface treatment for the purpose of improving the dispersibility and toughness of the whole conductive filler, it is possible to overcome defects such as deterioration in conductivity.

Whether or not the covering layer contains the resin having an active hydrogen-containing group and the compound having a functional group capable of reacting with the active hydrogen-containing group can be confirmed as follows.

First, the conductive filler is diluted with the solvent used for the conductive paste and separated by centrifugal separation from the conductive paste, and the solvent is removed to extract the conductive filler by a method avoiding heating such as vacuum drying. The solvent may be removed by air drying. At this time, the solvent used for the conductive paste usually does not completely dissolve the covering layer. Accordingly, unless time is required, kneading force is applied, or treatment such as heating is performed, the conductive filler can be separated with the covering layer being remained on the surface of the filler body.

Next, by conducting surface analysis of the extracted conductive filler, it is confirmed whether or not the resin having an active hydrogen-containing group and the compound having a functional group capable of reacting with the active hydrogen-containing group are contained. The surface analysis can be carried out by, for example, FT-IR.

Hereinafter, the filler body and the covering layer will be described in more detail.

Filler Body;

As the filler body, the conductive filler described above can be used as it is. Specifically, particles of metal such as silver, copper, or nickel, carbon fiber, or the like can be used. The filler body is preferably the above-described composite particles containing copper alloy powder containing at least one kind of transition metals belonging to groups 8 to 10 of the periodic table and a carbon material covering at least a portion of the surface of the copper alloy powder.

In the present invention, the average particle diameter of the filler body is not particularly limited, but can be set to, for example, 0.5 µm or more and 50 µm or less. The average particle diameter of the filler body is preferably 1 µm or more and 20 µm or less. The average particle diameter of the filler body may be 1 µm or more and 5 µm or less. Even in that case, a conductive layer having excellent conductivity can be formed.

Covering Layer;

The resin constituting the covering layer is not particularly limited, but a resin having an active hydrogen-containing group can be mentioned. In this case, the toughness of the conductive layer can be further enhanced.

Examples of the active hydrogen-containing group include at least one selected from the group consisting of a hydroxyl group, a carboxyl group, an amino group, an imino group and a thiol group. Among them, a hydroxyl group is preferred since the reaction progresses at room temperature with other mixing agents and there are few cases where consideration is given to storage stability.

A resin having an active hydrogen-containing group is not particularly limited as long as it contains an active hydrogen-containing group, and examples thereof include a polyvinyl acetal resin, a polyvinyl alcohol resin, a (meth)acrylic polymer containing an active hydrogen-containing group, a polyester resin containing an active hydrogen-containing group, a phenol resin, a polyurethane resin, and an epoxy resin. These may be used alone, or a plurality of these may be used in combination. The term "(meth)acrylic" refers to acrylic or methacrylic.

A resin having a hydroxyl group is not particularly limited as long as it contains a hydroxyl group, and examples thereof include a polyvinyl acetal resin, a polyvinyl alcohol resin, a (meth)acrylic polymer containing a hydroxyl group, a polyester resin containing a hydroxyl group, a phenol resin, a polyurethane resin, and an epoxy resin. These may be used alone, or a plurality of these may be used in combination.

Among them, a polyvinyl acetal resin is preferred from the viewpoint that the reactivity of the hydroxyl group is further higher, adverse effects such as moisture absorption can be further avoided, and the polarity of the surface of the conductive filler is more easily controlled. Specific examples thereof include a polyvinyl butyral resin and a polyvinyl acetoacetal resin, and a polyvinyl butyral resin is more preferred.

The content of the resin having an active hydrogen-containing group is preferably 0.1% by weight to 10% by weight with respect to 100% by weight of the conductive filler, more preferably 0.5% by weight to 2% by weight with respect to 100% by weight of the conductive filler. If the content of the resin having an active hydrogen-containing group is too small, the toughness may decrease. On the other hand, if the content of the resin having an active hydrogen-containing group is too large, the conductivity may not be sufficiently enhanced.

The resin having an active hydrogen-containing group and the compound having a functional group capable of reacting with the active hydrogen-containing group may be mixed and used for covering. That is, the resin having an active hydrogen-containing group and the compound having a functional group capable of reacting with the active hydrogen-containing group may be contained.

Examples of the functional group capable of reacting with the active hydrogen-containing group include an isocyanate group, a carboxyl group, an epoxy group, an ester group, and a metal alkoxy group. The compound having a functional group capable of reacting with the active hydrogen-containing group is not particularly limited as long as it has the functional group capable of reacting with the active hydrogen-containing group.

Examples of the compound having a functional group capable of reacting with the active hydrogen-containing group include a blocked isocyanate, a saturated (unsaturated) fatty acid and its anhydride, alkoxysilane, an epoxy resin, and a phenol resin. Among them, a blocked isocyanate is preferred. In this case, the reactivity can be further enhanced even at low temperature, and in addition, the reverse reaction hardly occurs. The blocked isocyanate has higher reactivity with the active hydrogen-containing group and, for example, can form a urethane bond. If the isocyanate group is left as it is, unpreferable cases such as increase in viscosity and change in surface treatment effect often occur when the isocyanate group reacts immediately upon mixing. Accordingly, it is desirable that the blocked isocyanate is protected with a blocking agent or the like before use. In many cases of the blocking agent, the isocyanate group is regenerated and reacts by dissociation with heat, and the blocking agent is widely used for, for example, coating materials for automobiles, building materials, home electric appliances, and the like and adhesives. Common blocking agents used for the blocked isocyanates include alcohol-based blocking agents, phenolic blocking agents, lactam-based blocking agents, oxime-based blocking agents, and the like.

The coating amount of the compound having a functional group capable of reacting with the active hydrogen-containing group is preferably 0.1% by weight to 10% by weight, more preferably 1% by weight to 5% by weight with respect to 100% by weight of the conductive filler.

If the content of the compound having a functional group capable of reacting with the active hydrogen-containing group is too small, the toughness may decrease. On the other hand, if the content of the compound having a functional group capable of reacting with the active hydrogen-containing group is too large, the conductivity may not be sufficiently enhanced.

(Binder Resin)

The binder resin is not particularly limited as long as it has a constant dry curing shrinkage amount, and a conventionally known thermosetting resin used as a binder resin of a conductive paste can be used. As the binder resin, for example, it is possible to preferably use a phenol resin, an epoxy resin, a polyurethane resin, a melamine resin, a urea resin, a compound having a dehydration-condensation group such as a silanol group, a polyimide resin using an ene reaction, a polyester resin, or the like.

Among them, a phenol resin can be more suitably used. As the phenol resin, a novolac type phenol resin or a resol type phenol resin can be used. Resol type phenol resins which are cured by dehydration condensation and are more likely to secure a shrinkage amount, and epoxy resins including resol type phenol resins as crosslinking agents can be still more suitably used. These may be used alone, or a plurality of these may be used in combination. In addition, a compound having a dehydration-condensation group such as a silanol group having a large shrinkage amount can be used alone, or a polyimide resin to which the compound is added as it is or the like can be suitably used.

(Solvent)

The conductive paste of the present invention may further contain a solvent. Since the solvent contributes to the dispersibility of the conductive filler as well as the polarity of the binder resin, selection taking into consideration of the polarity is often important. Depending on the method of the surface treatment of the conductive filler, the polarity is lowered when the conductive filler is covered with a covering material containing a carbon material or a polyvinyl butyral resin, for example. Thus, from the viewpoint of decreasing the dispersibility of the conductive filler in the binder resin and increasing the light transmittance of the dried-cured product, it is preferable to use a solvent having an SP value of 22 $MPa^{1/2}$ or more. When the solvent has a SP value of less than 22 $MPa^{1/2}$, the conductive filler is more uniformly dispersed in the conductive paste, and sufficient conductivity may not be exhibited.

The SP value of the solvent can be obtained from the literature information, the calculation methods of Hansen and Hoy, the Fedors' estimation method, or the like.

Examples of the solvent having an SP value of 22 $MPa^{1/2}$ or more include polar solvents such as triethanolamine, ethylene glycol, dimethyl sulfoxide, ethylene glycol monobutyl ether, propylene glycol monoethyl ether, triethylene glycol monomethyl ether, ethylene glycol monoisopropyl ether, diethylene glycol monoethyl ether, diethylene glycol monomethyl ether, propylene glycol monomethyl ether, ethylene glycol monoethyl ether, propylene glycol monophenyl ether, ethylene glycol monomethyl ether, 1,2-hexanediol, triethylene glycol, diethylene glycol or 1,3-butanediol, N,N-dimethylacetamide, N,N-dimethylformamide, and formamide. These may be used alone, or a plurality of these may be used in combination.

(Other Additives)

In the conductive paste according to the present invention, other additives may be added as necessary. Examples of the additives include an antistatic agent, a UV absorber, a plasticizer, a lubricant, a filler, a colorant, a weathering stabilizer, a lubricating agent, a crosslinking agent, an antiblocking agent and an antioxidant.

(Method for Producing Conductive Paste)

The conductive paste according to the present invention can be obtained, for example, by mixing a conductive filler and a binder resin and then kneading them. For the kneading, a dissolver or a three roll mill can be used. When a three roll mill is used, kneading is desirably performed by setting the gap between the rolls larger than the primary particle diameter of the conductive filler. Thus, a more uniform conductive paste can be obtained.

Hereinafter, the present invention will be clarified by way of specific examples and comparative examples of the present invention. The present invention should not be construed as limited to the following examples.

Example 1

Conductive Filler;

Step (A): Production of Composite Metal Powder

Composite metal powder serving as an alloy in which the weight ratio of copper to cobalt (copper/cobalt) was 99 wt %/1 wt % was produced by high pressure water atomization method and classified into composite metal powder having an average particle diameter of 3 μm by an air classifier.

Step (B): Covering Treatment for Composite Metal Powder

To 100 parts by weight of the composite metal powder (filler body) obtained in step (A), 50 parts by weight of tetrahydrofuran as a solvent and 0.5 parts by weight of oleic acid (manufactured by FUJIFILM Wako Pure Chemical Corporation, trade name "oleic acid") as a covering material were added and stirred, and then the solvent was removed by vacuum drying at room temperature for 12 hours to obtain composite metal powder (conductive filler) whose surface was covered with a covering layer.

Binder Resin and Other Additives;

As a resin 1, a resol type phenol resin (manufactured by Gun Ei Chemical Industry Co., Ltd., trade name: "PL-2211") was used. As an additive, a silanol group-containing compound was used. As a solvent, ethylene glycol and dimethylsulfoxide were used. Hereinafter, a binder resin composition was prepared by mixing the binder resin, the silanol group-containing compound, and the solvent at a ratio shown in Table 1 below. The silanol group-containing compound was produced as follows.

First, 40 parts by weight of water was added to 100 parts by weight of a silane coupling agent (manufactured by Shin-Etsu Chemical Co., Ltd., trade name "KBE 403") and stirred at room temperature for 4 days to obtain a silanol group-containing compound solution (hydrolyzed silane coupling agent). Although the solution was initially a two-phase white turbid dispersion, the phase became a transparent homogeneous phase by stirring, so that hydrolysis (formation of silanol group) of the coupling agent was confirmed. The solid content of the silanol group-containing compound solution was 54% by weight. In this solid content equivalent, a hydrolyzed silane coupling agent was added in an amount shown in Table 1 below (specifically, 1.7 parts by weight) to 100 parts by weight of a conductive filler.

Measurement of Light Transmittance;

A mixture prepared by adding 20 parts by weight of the conductive filler (different from a mixing ratio of a conductive paste described later) to 100 parts by weight of the binder resin was coated on a slide glass at a coating amount of 100 g/m², followed by drying and curing at 170° C. for 30 minutes. The light transmittance of the obtained test piece at a wavelength of 700 nm was measured by a spectrophotometer (product number "U-3900" manufactured by Hitachi High-Technologies Corporation). The light transmittance was measured using, as a base point, a slide glass that was obtained by coating with only the binder resin composition in the same manner, followed by drying and curing. The results of the light transmittance are shown in Table 1 below.

Measurement of Shrinkage Ratio;

The binder resin composition described above was coated in the same manner on a polyimide film (manufactured by Ube Industries, Ltd., trade name "UPIREX") at a coating amount equivalent to a dry solid content of 55 g/m² and then dried and cured at 170° C. for 30 minutes, and the shrinkage ratio in the one-dimensional direction was obtained from the amount of warp occurred. Specifically, the shrinkage ratio α (%) was obtained using the following formula (1) described above.

α=(1−(arc length of surface of second coating film after drying and curing)/(arc length of second substrate after drying and curing))×100    Formula (1)

Preparation of Conductive Paste;

Next, to 100 parts by weight of the conductive filler, a resol type phenol resin, a silanol group-containing compound, 4 parts by weight of ethylene glycol as a solvent, and 4 parts by weight of dimethyl sulfoxide as a solvent were added at a ratio shown in Table 1 below, and a conductive paste was prepared by three-roll kneading.

Example 2

The light transmittance and the shrinkage ratio were measured in the same manner as in Example 1, except that in place of oleic acid, 2 parts by weight of a blocked isocyanate (manufactured by DIC Corporation, trade name "BARNOC D-550"), 1.2 parts by weight of a polyvinyl butyral resin (manufactured by Sekisui Chemical Co., Ltd., trade name "BM-S"), and 0.5 parts by weight of stearic acid were used as materials of a covering material, and, in addition, a conductive paste was prepared.

Example 3

Step (C): Treatments Performed in Low-Temperature Carbon Attachment Step to High-Temperature Heat Treatment Step for Composite Metal Powder 6 g of the composite metal powder obtained in the same manner as in step (A) of Example 1 was introduced into a cylindrical quartz cell having an inner diameter of 26 mm and a length of 120 mm. This was disposed in a rotary kiln including a rotary cylindrical quartz tube having an inner diameter of 32 mm and a length of 700 mm, and according to the heat profile shown in FIG. 4, ethylene as a carbon source was brought into contact on the composite metal powder. Consequently, 1.5% by weight of carbon fiber was attached to the surface of the composite metal powder. That is, in step 1-A of FIG. 4, the temperature was raised from room temperature to 350° C. at a temperature rising time of 10 minutes in an ethylene gas atmosphere, raised to 475° C. after replacement with a nitrogen gas atmosphere in step 1-B, and then maintained for 30 minutes. Thereafter, after replacement with an ethylene gas atmosphere for 2 minutes while the temperature was maintained at 475° C. in step 1-C, the atmosphere was replaced with a nitrogen gas atmosphere in step 3-A, and after the temperature was maintained at 925° C. for 30 minutes, cooling was performed. The amount of carbon fiber attached is a ratio of carbon fiber to composite metal powder to which the carbon fiber is attached.

Step (D): Covering Treatment for Composite Metal Powder

To 100 parts by weight of composite metal powder (filler body) to which 1.5% by weight of the above-described carbon fiber was attached, 50 parts by weight of tetrahydrofuran as a solvent and 0.5 parts by weight of oleic acid (manufactured by FUJIFILM Wako Pure Chemical Corporation, trade name "oleic acid") as a covering material were added and stirred, and then the solvent was removed by vacuum drying at room temperature for 12 hours to obtain composite metal powder (conductive filler) whose surface was covered with a covering layer. In other points, the light transmittance and the shrinkage ratio (the film thickness (coating thickness) at the time of shrinkage ratio measurement was 65 μm) were measured in the same manner as in Example 1, except that no silanol group-containing compound was used and 4 parts by weight of ethyl carbitol was used as a solvent, and, in addition, a conductive paste was prepared.

Example 4

The light transmittance and the shrinkage ratio (the film thickness (coating thickness) at the time of shrinkage ratio measurement was 60 μm) were measured in the same manner as in Example 3, except that in place of oleic acid, 3.2 parts by weight of a blocked isocyanate (manufactured by DIC Corporation, trade name "BARNOC D-550"), 0.75 parts by weight of a polyvinyl butyral resin (manufactured by Sekisui Chemical Co., Ltd., trade name "BM-S"), and 1 part by weight of stearic acid were used as covering materials and a silanol group-containing compound and ethylene glycol and dimethyl sulfoxide as solvents were used in the same manner as in Example 1, and, in addition, a conductive paste was prepared.

Example 5

The light transmittance and the shrinkage ratio (the film thickness (coating thickness) at the time of shrinkage ratio measurement was 50 μm) were measured in the same manner as in Example 4, except that, in terms of solid content, 9.6 parts by weight of a resol type phenol resin (manufactured by Gun Ei Chemical Industry Co., Ltd., trade name "PL-2211") as the resin 1 and 2.4 parts by weight of a bisphenol A-type epoxy resin (manufactured by Kukdo Chemical Co., Ltd., trade name "YD-127") as the resin 2 were used as binder resins with respect to 100 parts by weight of the conductive filler, no silanol group-containing compound was used, and 4 parts by weight of ethyl carbitol was used as a solvent, and, in addition, a conductive paste was prepared.

Example 6

Decahydronaphthalene (manufactured by FUJIFILM Wako Pure Chemical Corporation) was used as a covering material instead of oleic acid. In terms of solid content, 3.36 parts by weight of 4,4'-(1-methylethylidene)bis(2-allylphenol) (manufactured by FUJIFILM Wako Pure Chemical Corporation) as the resin 1 and 6.72 parts by weight of 4,4'-bismaleimide diphenylmethane (manufactured by Tokyo Chemical Industry Co., Ltd.) as the resin 2 were used as binder resins with respect to 100 parts by weight of the conductive filler. The silanol group-containing compound was used in the same manner as in Example 1. In addition, as a solvent, 4 parts by weight of furfuryl alcohol and 4 parts by weight of formamide were used with respect to 100 parts by weight of the conductive filler. The light transmittance and the shrinkage ratio (the film thickness (coating thickness) at the time of shrinkage ratio measurement was 43 μm) were measured in the same manner as in Example 3, except for the above points, and, in addition, a conductive paste was prepared.

Example 7

Decahydronaphthalene (manufactured by FUJIFILM Wako Pure Chemical Corporation) was used as a covering material instead of oleic acid. As a binder resin, a silanol group-containing compound as the resin 1 was used. In addition, as a solvent, 4 parts by weight of ethylene glycol and 4 parts by weight of triethanolamine were used with respect to 100 parts by weight of the conductive filler. The light transmittance and the shrinkage ratio (the film thickness (coating thickness) at the time of shrinkage ratio measurement was 50 μm) were measured in the same manner as in Example 3, except for the above points, and, in addition, a conductive paste was prepared. The silanol group-containing compound as the resin 1 was produced as follows.

First, 100 parts by weight of water was added to 100 parts by weight of a silane coupling agent (manufactured by Shin-Etsu Chemical Co., Ltd., trade name "KBE 403") and stirred at room temperature for 4 days to obtain a silanol group-containing compound solution (hydrolyzed silane coupling agent). Subsequently, 80 parts by weight of tetraethyl orthosilicate (manufactured by FUJIFILM Wako Pure Chemical Corporation) was added, and the mixture was further stirred at room temperature for 2 days. Although the solution was initially a two-phase white turbid dispersion, the phase became a transparent homogeneous phase by stirring, so that hydrolysis (formation of silanol group) of the coupling agent was confirmed. 50 parts by weight of hexamethylenediamine (manufactured by FUJIFILM Wako Pure Chemical Corporation) as a crosslinking accelerator was added to the hydrolyzate described above to obtain a silanol group-containing compound solution. The solid content of the silanol group-containing compound solution was 46% by weight. In this solid content equivalent, 8.68 parts by weight of the silanol group-containing compound solution was added to 100 parts by weight of the conductive filler.

Example 8

The light transmittance and the shrinkage ratio (the film thickness (coating thickness) at the time of shrinkage ratio measurement was 50 μm) were measured in the same manner as in Example 7, except that composite metal powder (conductive filler) whose surface was not covered with a covering layer was used without using a covering material, and, in addition, a conductive paste was prepared.

Example 9

The light transmittance and the shrinkage ratio (the film thickness (coating thickness) at the time of shrinkage ratio measurement was 60 μm) were measured in the same manner as in Example 4, except that a polyvinyl acetoacetal resin (manufactured by Sekisui Chemical Co., Ltd., trade name "KS-5Z") was used in place of the polyvinyl butyral resin, and, in addition, a conductive paste was prepared.

Comparative Example 1

The light transmittance and the shrinkage ratio were measured in the same manner as in Example 1, except that copper powder (manufactured by DOWA Electronics Materials Co., Ltd., electrolytic copper powder, copper: 100% by weight) was used as a filler body and the amount of oleic acid added was 1 part by weight, and, in addition, a conductive paste was prepared.

Comparative Example 2

The light transmittance and the shrinkage ratio were measured in the same manner as in Example 1, except that the composite metal powder obtained in step (A) in Example 1 was used as it was as a conductive filler, and, in addition, a conductive paste was prepared.

Comparative Example 3

The light transmittance and shrinkage amount were measured in the same manner as in Example 4, except that composite metal powder to which 1.5% by weight of carbon fiber was attached was used as it was as a conductive filler, and, in addition, a conductive paste was prepared.

Comparative Example 4

The light transmittance and the shrinkage ratio (the film thickness (coating thickness) at the time of shrinkage ratio measurement was 50 μm) were measured in the same manner as in Example 5, except that, in terms of solid content, 2.4 parts by weight of a resol type phenol resin (manufactured by Gun Ei Chemical Industry Co., Ltd., trade name "PL-2211") as the resin 1 and 9.6 parts by weight of a bisphenol A-type epoxy resin (manufactured by Kukdo Chemical Co., Ltd., trade name "YD-127") as the resin 2 were used as binder resins with respect to 100 parts by weight of the conductive filler, and, in addition, a conductive paste was prepared.

Comparative Example 5

As a silanol group-containing compound, a compound prepared as follows was used. As a solvent, 8 parts by weight of ethylene glycol was used with respect to 100 parts by weight of the conductive filler. The light transmittance and the shrinkage ratio (the film thickness (coating thickness) at the time of shrinkage ratio measurement was 62 μm) were measured in the same manner as in Example 7, except for the above points, and, in addition, a conductive paste was prepared. The silanol group-containing compound was produced as follows.

First, 100 parts by weight of water was added to 100 parts by weight of a silane coupling agent (manufactured by Shin-Etsu Chemical Co., Ltd., trade name "KBE 403") and stirred at room temperature for 4 days to obtain a silanol group-containing compound solution (hydrolyzed silane coupling agent). Although the solution was initially a two-phase white turbid dispersion, the phase became a transparent homogeneous phase by stirring, so that hydrolysis (formation of silanol group) of the coupling agent was confirmed. The solid content of the silanol group-containing compound solution was 54% by weight. In this solid content equivalent, 8.68 parts by weight of the silanol group-containing compound solution was added to 100 parts by weight of the conductive filler.

Comparative Example 6

The light transmittance and the shrinkage ratio (the film thickness (coating thickness) at the time of shrinkage ratio measurement was 60 μm) were measured in the same manner as in Example 4, except that as a covering material, a blocked isocyanate and stearic acid were not used and only 0.75 parts by weight of a polyvinyl butyral resin was used, and, in addition, a conductive paste was prepared.

Comparative Example 7

The light transmittance and the shrinkage ratio (the film thickness (coating thickness) at the time of shrinkage ratio measurement was 60 μm) were measured in the same manner as in Example 4, except that as covering materials, no polyvinyl butyral resin was used but only 3.2 parts by weight of blocked isocyanate and 1 part by weight of stearic acid were used, and, in addition, a conductive paste was prepared.

<Evaluation>
Shrinkage Ratio;

FIG. 5 is a graph showing a relationship between film thickness (coating thickness) and shrinkage ratio of second coating films obtained in Examples 1 to 9 and Comparative Examples 1 to 7. The formula A in FIG. 5 indicates $\alpha=(5t+50)\times10^{-3}$. The film thickness at the time of shrinkage ratio measurement is taken as the film thickness of the coating film excluding the substrate.

As shown in FIG. 5, Examples 1 to 9 and Comparative Examples 1 to 3, 6 and 7 satisfied $\alpha \geq (5t+50)\times10^{-3}$ (2). On the other hand, Comparative Examples 4 and 5 satisfied $\alpha<(5t+50)\times10^{-3}$. The film thickness of the second coating film is set as t μm and the shrinkage ratio is set as α %.

Breaking Elongation Rate of Conductive Layer (Conductive Layer Breaking Elongation Rate);

The conductive paste obtained in each of Examples 2, 4, 5 and 9 and Comparative Examples 2, 6 and 7 was coated on a polyimide film (manufactured by Ube Industries, Ltd., trade name "UPIREX") which was punched into a No. 1 dumbbell shape defined in JIS K 6251. Thereafter, the binder resin in the conductive paste was crosslinked by drying at a temperature of 170° C. for 30 minutes. Consequently, a conductive layer having a thickness of 50 μm was formed on a polyimide film punched into a dumbbell shape. A tensile test (product number "Tensilon UTA-5000", manufactured by Orientec Co., Ltd.) was performed on the formed dumbbell-shaped test piece at a test speed of 1 mm/min. Since a breaking point having the lowest distortion occurred with a distortion considerably lower than the breaking point of the polyimide film, this distortion was taken as breaking distortion at the breaking point of the conductive layer. When a change rate between an initial length $L_0$ at that time and a length $L_f$ after breaking was set as a conductive layer breaking elongation rate δ, the conductive layer breaking elongation rate δ was calculated in percentage (%) by δ (%) $((L_f-L_0)/L_0)\times100$, and the results were shown in Tables 1 to 3.

Specific Resistance;

The conductive paste obtained in each of Examples 1 to 9 and Comparative Examples 1 to 7 was screen-printed and coated, and then dried at a temperature of 170° C. for 30 minutes. Consequently, the binder resin in the conductive paste was crosslinked to form a conductive layer having a width of 1 mm, a length of 50 mm, and a thickness of 50 μm on slide glass. The specific resistance of the formed conductive layer was obtained from a resistance value between both ends of the conductive layer.

The results are shown in Tables 1 to 3 below.

TABLE 1

| | | Example 1 | Example 2 | Example 3 |
|---|---|---|---|---|
| Conductive filler | Composite metal powder | 99% by weight of copper/ 1% by weight of cobalt | 99% by weight of copper/ 1% by weight of cobalt | 99% by weight of copper/ 1% by weight of cobalt |
| | Other components | | | 1.5% by weight of carbon fiber |
| | Covering material | 0.5 parts by weight of oleic acid | 2 parts by weight of blocked isocyanate 1.2 parts by weight of polyvinyl butyral resin 0.5 parts by weight of stearic acid | 0.5 parts by weight of oleic acid |
| | Average particle diameter | 3 μm | 3 μm | 3 μm |
| | Mixing amount (parts by weight) | 100 | 100 | 100 |
| Binder resin | Resin 1 | Resol type phenol resin | Resol type phenol resin | Resol type phenol resin |
| | Mixing amount (solid content) with respect to 100 parts by weight of conductive filler (parts by weight) | 10.3 | 10.3 | 10.3 |
| | Resin 2 | | | |
| | Mixing amount with respect to 100 parts by weight of conductive filler (parts by weight) | | | |
| Silanol group-containing compound | Type | Hydrolyzed silane coupling agent | Hydrolyzed silane coupling agent | |
| | Mixing amount (solid content) with respect to 100 parts by weight of conductive filler (parts by weight) | 1.7 | 1.7 | |
| Solvent | Type | Ethylene glycol/ dimethyl sulfoxide | Ethylene glycol/ dimethyl sulfoxide | Ethyl carbitol |
| | Mixing amount with respect to 100 parts by weight of conductive filler (parts by weight) | 4/4 | 4/4 | 4 |
| Light transmittance at wavelength of 700 nm (%) | | 30 | 32 | 29 |
| Shrinkage ratio (%) | | 0.74 | 0.74 | 0.61 |
| Film thickness (thickness of coating film) at the time of shrinkage ratio measurement (μm) | | 60 | 60 | 65 |

TABLE 1-continued

| | | |
|---|---|---|
| Conductive layer breaking elongation rate (%) | — | 0.08 | — |
| Specific resistance (Ω · cm) | $3.0 \times 10^{-4}$ | $3.0 \times 10^{-4}$ | $2.0 \times 10^{-4}$ |

| | | | Example 4 | Example 5 |
|---|---|---|---|---|
| Conductive filler | Composite metal powder | | 99% by weight of copper/ 1% by weight of cobalt | 99% by weight of copper/ 1% by weight of cobalt |
| | Other components | | 1.5% by weight of carbon fiber | 1.5% by weight of carbon fiber |
| | Covering material | | 3.2 parts by weight of blocked isocyanate 0.75 parts by weight of polyvinyl butyral resin 1 part by weight of stearic acid | 3.2 parts by weight of blocked isocyanate 0.75 parts by weight of polyvinyl butyral resin 1 part by weight of stearic acid |
| | Average particle diameter | | 3 μm | 3 μm |
| | Mixing amount (parts by weight) | | 100 | 100 |
| Binder resin | Resin 1 | | Resol type phenol resin | Resol type phenol resin |
| | Mixing amount (solid content) with respect to 100 parts by weight of conductive filler (parts by weight) | | 10.3 | 9.6 |
| | Resin 2 | | | Bisphenol A-type epoxy resin |
| | Mixing amount with respect to 100 parts by weight of conductive filler (parts by weight) | | | 2.4 |
| Silanol group-containing compound | Type | | Hydrolyzed silane coupling agent | |
| | Mixing amount (solid content) with respect to 100 parts by weight of conductive filler (parts by weight) | | 1.7 | |
| Solvent | Type | | Ethylene glycol/ dimethyl sulfoxide | Ethyl carbitol |
| | Mixing amount with respect to 100 parts by weight of conductive filler (parts by weight) | | 4/4 | 4 |
| Light transmittance at wavelength of 700 nm (%) | | | 29 | 23 |
| Shrinkage ratio (%) | | | 0.74 | 0.39 |
| Film thickness (thickness of coating film) at the time of shrinkage ratio measurement (μm) | | | 60 | 50 |
| Conductive layer breaking elongation rate (%) | | | 0.1 | 0.06 |
| Specific resistance (Ω · cm) | | | $0.8 \times 10^{-4}$ | $9.0 \times 10^{-4}$ |

TABLE 2

| | | Example 6 | Example 7 | Example 8 |
|---|---|---|---|---|
| Conductive filler | Composite metal powder | 99% by weight of copper/1% by weight of cobalt | 99% by weight of copper/1% by weight of cobalt | 99% by weight of copper/1% by weight of cobalt |
| | Other components | 1.5% by weight of carbon fiber | 1.5% by weight of carbon fiber | 1.5% by weight of carbon fiber |
| | Covering material | 0.5 parts by weight of decahydronaphthalene | 0.5 parts by weight of decahydronaphthalene | None |
| | Average particle diameter | 3 μm | 3 μm | 3 μm |
| | Mixing amount (parts by weight) | 100 | 100 | 100 |
| Binder resin | Resin 1 | 4,4'-(1-methylethylidene)bis (2-allylphenol) | Silanol group-containing compound | Silanol group-containing compound |
| | Mixing amount (solid content) with respect to 100 parts by weight of conductive filler (parts by weight) | 3.36 | 8.68 | 8.68 |

TABLE 2-continued

|  |  |  |  |  |
|---|---|---|---|---|
|  | Resin 2 | 4,4'-bismaleimide diphenylmethane |  |  |
|  | Mixing amount with respect to 100 parts by weight of conductive filler (parts by weight) | 6.72 |  |  |
| Silanol group-containing compound | Type | Hydrolyzed silane coupling agent |  |  |
|  | Mixing amount (solid content) with respect to 100 parts by weight of conductive filler (parts by weight) | 1.7 |  |  |
| Solvent | Type | Furfuryl alcohol/ formamide | Ethylene glycol/ triethanolamine | Ethylene glycol/ triethanolamine |
|  | Mixing amount with respect to 100 parts by weight of conductive filler (parts by weight) | 4/4 | 4/4 | 4/4 |
|  | Light transmittance at wavelength of 700 nm (%) | 27 | 30 | 22 |
|  | Shrinkage ratio (%) | 0.63 | 0.61 | 0.61 |
|  | Film thickness (thickness of coating film) at the time of shrinkage ratio measurement (μm) | 43 | 50 | 50 |
|  | Conductive layer breaking elongation rate (%) | — | — | — |
|  | Specific resistance (Ω · cm) | $7.0 \times 10^{-4}$ | $5.0 \times 10^{-4}$ | $1.0 \times 10^{-3}$ |

|  |  |  | Example 9 | Comparative Example 1 |
|---|---|---|---|---|
| Conductive filler | Composite metal powder |  | 99% by weight of copper/ 1% by weight of cobalt | 100% by weight of copper |
|  | Other components |  | 1.5% by weight of carbon fiber |  |
|  | Covering material |  | 3.2 parts by weight of blocked isocyanate 0.75 parts by weight of polyvinyl acetoacetal resin 1 part by weight of stearic acid | 1 part by weight of oleic acid |
|  | Average particle diameter |  | 3 μm | 7 μm |
|  | Mixing amount (parts by weight) |  | 100 | 100 |
| Binder resin | Resin 1 |  | Resol type phenol resin | Resol type phenol resin |
|  | Mixing amount (solid content) with respect to 100 parts by weight of conductive filler (parts by weight) |  | 10.3 | 10.3 |
|  | Resin 2 |  |  |  |
|  | Mixing amount with respect to 100 parts by weight of conductive filler (parts by weight) |  |  |  |
| Silanol group-containing compound | Type |  | Hydrolyzed silane coupling agent | Hydrolyzed silane coupling agent |
|  | Mixing amount (solid content) with respect to 100 parts by weight of conductive filler (parts by weight) |  | 1.7 | 1.7 |
| Solvent | Type |  | Ethylene glycol/ dimethyl sulfoxide | Ethylene glycol/ dimethyl sulfoxide |
|  | Mixing amount with respect to 100 parts by weight of conductive filler (parts by weight) |  | 4/4 | 4/4 |
|  | Light transmittance at wavelength of 700 nm (%) |  | 21 | 10 |
|  | Shrinkage ratio (%) |  | 0.74 | 0.74 |
|  | Film thickness (thickness of coating film) at the time of shrinkage ratio measurement (μm) |  | 60 | 60 |

TABLE 2-continued

|  |  |  |
|---|---|---|
| Conductive layer breaking elongation rate (%) | 0.06 | — |
| Specific resistance (Ω · cm) | $5.0 \times 10^{-4}$ | $3.0 \times 10^{-2}$ |

TABLE 3

|  |  | Comparative Example 2 | Comparative Example 3 | Comparative Example 4 |
|---|---|---|---|---|
| Conductive filler | Composite metal powder | 99% by weight of copper/1% by weight of cobalt | 99% by weight of copper/1% by weight of cobalt | 99% by weight of copper/1% by weight of cobalt |
|  | Other components |  | 1.5% by weight of carbon fiber | 1.5% by weight of carbon fiber |
|  | Covering material |  |  | 3.2 parts by weight of blocked isocyanate 0.75 parts by weight of polyvinyl butyral resin 1 part by weight of stearic acid |
|  | Average particle diameter | 3 μm | 3 μm | 3 μm |
|  | Mixing amount (parts by weight) | 100 | 100 | 100 |
| Binder resin | Resin 1 | Resol type phenol resin | Resol type phenol resin | Resol type phenol resin |
|  | Mixing amount (solid content) with respect to 100 parts by weight of conductive filler (parts by weight) | 10.3 | 10.3 | 2.4 |
|  | Resin 2 |  |  | Bisphenol A-type epoxy resin |
|  | Mixing amount with respect to 100 parts by weight of conductive filler (parts by weight) |  |  | 9.6 |
| Silanol group-containing compound | Type | Hydrolyzed silane coupling agent | Hydrolyzed silane coupling agent |  |
|  | Mixing amount (solid content) with respect to 100 parts by weight of conductive filler (parts by weight) | 1.7 | 1.7 |  |
| Solvent | Type | Ethylene glycol/dimethyl sulfoxide | Ethylene glycol/dimethyl sulfoxide | Ethyl carbitol |
|  | Mixing amount with respect to 100 parts by weight of conductive filler (parts by weight) | 4/4 | 4/4 | 4 |
| Light transmittance at wavelength of 700 nm (%) |  | 9 | 11 | 5 |
| Shrinkage ratio (%) |  | 0.74 | 0.74 | 0.24 |
| Film thickness (thickness of coating film) at the time of shrinkage ratio measurement (μm) |  | 60 | 60 | 50 |
| Conductive layer break elongation rate (%) |  | 0.02 | — | — |
| Specific resistance (Ω · cm) |  | $8.0 \times 10$ | $3.0 \times 10^{1}$ | Measurement impossible due to excessive resistance |

|  |  | Comparative Example 5 | Comparative Example 6 | Comparative Example 7 |
|---|---|---|---|---|
| Conductive filler | Composite metal powder | 99% by weight of copper/1% by weight of cobalt | 99% by weight of copper/1% by weight of cobalt | 99% by weight of copper/1% by weight of cobalt |
|  | Other components | 1.5% by weight of carbon fiber | 1.5% by weight of carbon fiber | 1.5% by weight of carbon fiber |
|  | Covering material | 0.5 parts by weight of decahydronaphthalene | 0.75 parts by weight of polyvinyl butyral resin | 3.2 parts by weight of blocked isocyanate 1 part by weight of stearic acid |

TABLE 3-continued

| | | | | |
|---|---|---|---|---|
| | Average particle diameter | 3 μm | 3 μm | 3 μm |
| | Mixing amount (parts by weight) | 100 | 100 | 100 |
| Binder resin | Resin 1 | Silanol group-containing compound | Resol type phenol resin | Resol type phenol resin |
| | Mixing amount (solid content) with respect to 100 parts by weight of conductive filler (parts by weight) | 8.68 | 10.3 | 10.3 |
| | Resin 2 | | | |
| | Mixing amount with respect to 100 parts by weight of conductive filler (parts by weight) | | | |
| Silanol group-containing compound | Type | | Hydrolyzed silane coupling agent | Hydrolyzed silane coupling agent |
| | Mixing amount (solid content) with respect to 100 parts by weight of conductive filler (parts by weight) | | 1.7 | 1.7 |
| Solvent | Type | Ethylene glycol | Ethylene glycol/ dimethyl sulfoxide | Ethylene glycol/ dimethyl sulfoxide |
| | Mixing amount with respect to 100 parts by weight of conductive filler (parts by weight) | 8 | 4/4 | 4/4 |
| Light transmittance at wavelength of 700 nm (%) | | 23 | 11 | 10 |
| Shrinkage ratio (%) | | 0.22 | 0.74 | 0.74 |
| Film thickness (thickness of coating film) at the time of shrinkage ratio measurement (μm) | | 62 | 60 | 60 |
| Conductive layer break elongation rate (%) | | — | 0.03 | 0.04 |
| Specific resistance (Ω · cm) | | $2.0 \times 10^2$ | $3.0 \times 10^1$ | $9.0 \times 10^2$ |

EXPLANATION OF SYMBOLS

1: First coating film
2: Binder resin
3: Conductive filler

The invention claimed is:

1. A conductive paste comprising a conductive filler and a binder resin,
  wherein the conductive filler has a filler body and a covering layer covering at least a portion of a surface of the filler body, the filler body is a composite particle containing copper alloy powder containing at least one kind of transition metals belonging to groups 8 to 10 of the periodic table and a carbon material covering at least a portion of a surface of the copper alloy powder,
  the covering layer contains a resin having an active hydrogen-containing group and a compound having a functional group capable of reacting with the active hydrogen-containing group, and
  the active hydrogen-containing group is a hydroxyl group,
  when a first coating film is prepared by coating a first paste containing 100 parts by weight of the binder resin and 20 parts by weight of the conductive filler on a first substrate at a coating amount of 100 g/m² and drying and curing the binder resin, the first coating film having a light transmittance of 20% or more, and
  when a second coating film is prepared by coating a second paste containing the binder resin but not containing the conductive filler on a second substrate at a coating amount equivalent to a dry solid content of 55 g/m² and drying and curing the binder resin, a film thickness t μm of the second coating film and a shrinkage ratio α % obtained by the following formula (1) satisfying a relationship of the following formula (2):

α=(1−(arc length of surface of second coating film after drying and curing)/(arc length of second substrate after drying and curing))×100   Formula (1); and α≥(5t+50)×10⁻³   Formula (2).

2. The conductive paste according to claim 1, wherein the conductive filler has an average particle diameter of 1 μm or more and 5 μm or less.

3. The conductive paste according to claim 1, wherein the resin having an active hydrogen-containing group is a polyvinyl acetal resin.

4. The conductive paste according to claim 1, wherein the compound having a functional group capable of reacting with the active hydrogen-containing group is a blocked isocyanate.

5. The conductive paste according to claim 1, wherein the transition metal is cobalt.

6. The conductive paste according to claim 1, wherein the carbon material is a carbon fiber.

* * * * *